US012581974B2

(12) United States Patent
Shin et al.

(10) Patent No.: US 12,581,974 B2
(45) Date of Patent: Mar. 17, 2026

(54) SEMICONDUCTOR DEVICE AND METHOD OF MAKING A SEMICONDUCTOR PACKAGE WITH GRAPHENE-COATED INTERCONNECTS

(71) Applicant: STATS ChipPAC Pte. Ltd., Singapore (SG)

(72) Inventors: YongMoo Shin, Incheon (KR); HeeSoo Lee, Incheon (KR); EunHee Myung, Gyeonggi-do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 419 days.

(21) Appl. No.: 18/150,634

(22) Filed: Jan. 5, 2023

(65) Prior Publication Data

US 2024/0234292 A1 Jul. 11, 2024

(51) Int. Cl.
*H01L 23/498* (2006.01)
*H01L 21/48* (2006.01)
(Continued)

(52) U.S. Cl.
CPC .... *H01L 23/49877* (2013.01); *H01L 21/4853* (2013.01); *H01L 21/4867* (2013.01); *H01L 21/565* (2013.01); *H01L 23/3107* (2013.01); *H01L 23/49816* (2013.01); *H01L 23/49833* (2013.01); *H01L 23/49838* (2013.01); *H01L 25/105* (2013.01); *H01L 25/162* (2013.01); *H01L 25/165* (2013.01); *H01L 24/16* (2013.01); *H01L 2224/16227* (2013.01); *H01L 2225/1023* (2013.01); *H01L 2225/1041* (2013.01);
(Continued)

(58) Field of Classification Search
None
See application file for complete search history.

(56) References Cited

U.S. PATENT DOCUMENTS 6,114,413 A 9/2000 Kang et al.
7,659,145 B2 2/2010 Do et al.
(Continued)

FOREIGN PATENT DOCUMENTS

CN 102867793 A 1/2013
CN 110071074 A 7/2019
(Continued)

OTHER PUBLICATIONS

Graphmatech, "Graphmatech's Graphene Technology Unlocks the Potential of Copper Additive Manufacturing" Website: https://graphmatech.com/graphmatechs-graphene-technology-unlocks-the-potential-of-copper-additive-manufacturing/, Feb. 9, 2021, Uppsala, Sweden.
(Continued)

*Primary Examiner* — Long Pham
(74) *Attorney, Agent, or Firm* — Brian M. Kaufman; Robert D. Atkins; PATENT LAW GROUP: Atkins and Associates, P.C.

(57) ABSTRACT

A semiconductor device includes a first substrate and a second substrate. A graphene-coated interconnect is disposed between the first substrate and second substrate. A semiconductor die is disposed between the first substrate and second substrate. The first substrate is electrically coupled to the second substrate through the graphene-coated interconnect. An encapsulant is deposited between the first substrate and second substrate.

24 Claims, 11 Drawing Sheets

(51) Int. Cl.

| | |
|---|---|
| *H01L 21/56* | (2006.01) |
| *H01L 23/31* | (2006.01) |
| *H01L 25/10* | (2006.01) |
| *H01L 25/16* | (2023.01) |
| *H01L 23/00* | (2006.01) |

(52) U.S. Cl.

CPC ................ *H01L 2225/1058* (2013.01); *H01L 2225/1094* (2013.01); *H01L 2924/15331* (2013.01); *H01L 2924/182* (2013.01)

(56) References Cited

U.S. PATENT DOCUMENTS

| | | | |
|---|---|---|---|
| 7,700,943 B2 | 4/2010 | Raravikar et al. | |
| 7,886,813 B2 | 2/2011 | Hua et al. | |
| 7,989,707 B2 * | 8/2011 | Yamano | H01L 21/6835 257/690 |
| 8,106,495 B2 * | 1/2012 | Kajiki | H01L 21/565 257/E23.18 |
| 8,107,242 B2 | 1/2012 | Yoshimoto et al. | |
| 8,263,439 B2 | 9/2012 | Marimuthu et al. | |
| 8,421,232 B2 | 4/2013 | Ikeda et al. | |
| 8,535,553 B2 | 9/2013 | Kong et al. | |
| 8,623,753 B1 | 1/2014 | Yoshida et al. | |
| 8,643,185 B2 | 2/2014 | Kajiwara et al. | |
| 8,710,649 B1 | 4/2014 | Huemoeller et al. | |
| 8,927,334 B2 | 1/2015 | Daubenspeck et al. | |
| 9,070,677 B2 | 6/2015 | Park | |
| 9,105,613 B1 | 8/2015 | Chen et al. | |
| 9,144,183 B2 | 9/2015 | Chen et al. | |
| 9,202,742 B1 | 12/2015 | Kim et al. | |
| 9,305,854 B2 | 4/2016 | Shim et al. | |
| 9,337,073 B2 | 5/2016 | Liu et al. | |
| 9,406,533 B2 | 8/2016 | Chi et al. | |
| 9,576,922 B2 | 2/2017 | Brunschwiler et al. | |
| 9,698,075 B2 | 7/2017 | Venugopal et al. | |
| 9,780,071 B2 | 10/2017 | Lee et al. | |
| 9,859,200 B2 * | 1/2018 | Park | H01L 23/3142 |
| 9,916,989 B2 | 3/2018 | Yoon et al. | |
| 10,287,471 B2 | 5/2019 | Zhang et al. | |
| 10,322,472 B2 | 6/2019 | Hattori et al. | |
| 10,340,154 B2 | 7/2019 | Kamikoriyama et al. | |
| 10,421,123 B2 | 9/2019 | Jeong et al. | |
| 10,510,733 B2 | 12/2019 | Kumar et al. | |
| 10,566,104 B2 | 2/2020 | Lee et al. | |
| 10,600,743 B2 | 3/2020 | Lee et al. | |
| 10,784,181 B2 | 9/2020 | Fu et al. | |
| 10,854,549 B2 | 12/2020 | Nakano | |
| 10,867,936 B2 | 12/2020 | Wang et al. | |
| 10,872,879 B2 | 12/2020 | Kim et al. | |
| 11,437,308 B2 | 9/2022 | Rho et al. | |
| 11,652,060 B2 | 5/2023 | Gomes et al. | |
| 11,810,844 B2 | 11/2023 | Mok | |
| 12,388,029 B2 * | 8/2025 | Yim | H01L 23/5389 |
| 2002/0104669 A1 | 8/2002 | Underwood et al. | |
| 2006/0007661 A1 | 1/2006 | Iketaki | |
| 2009/0096100 A1 | 4/2009 | Kajiwara et al. | |
| 2009/0152715 A1 | 6/2009 | Shim et al. | |
| 2010/0109688 A1 | 5/2010 | Eldridge et al. | |
| 2010/0129648 A1 | 5/2010 | Xu et al. | |
| 2011/0006425 A1 | 1/2011 | Wada et al. | |
| 2012/0018897 A1 | 1/2012 | Park et al. | |
| 2012/0132930 A1 | 5/2012 | Young et al. | |
| 2013/0056703 A1 | 3/2013 | Elian et al. | |
| 2013/0075923 A1 | 3/2013 | Park et al. | |
| 2013/0082364 A1 | 4/2013 | Wang et al. | |
| 2014/0024211 A1 * | 1/2014 | Ott | H01L 23/52 257/E21.585 |
| 2014/0103527 A1 * | 4/2014 | Marimuthu | H01L 21/486 257/737 |
| 2015/0179602 A1 | 6/2015 | Camacho et al. | |
| 2016/0039662 A1 | 2/2016 | Lin et al. | |
| 2016/0137507 A1 | 5/2016 | You et al. | |
| 2016/0286698 A1 | 9/2016 | Chang et al. | |
| 2017/0033086 A1 | 2/2017 | Homma et al. | |
| 2017/0130034 A1 | 5/2017 | Hwang et al. | |
| 2017/0167716 A1 | 6/2017 | Ezaki et al. | |
| 2018/0323170 A1 | 11/2018 | Kim et al. | |
| 2018/0346679 A1 | 12/2018 | Shishkin et al. | |
| 2019/0139902 A1 | 5/2019 | Lee et al. | |
| 2019/0181082 A1 | 6/2019 | Chen et al. | |
| 2019/0206839 A1 | 7/2019 | Balakrishnan et al. | |
| 2019/0259685 A1 | 8/2019 | Hussain et al. | |
| 2019/0348344 A1 | 11/2019 | Lu et al. | |
| 2019/0382627 A1 | 12/2019 | Hu et al. | |
| 2019/0394898 A1 | 12/2019 | Manninen et al. | |
| 2020/0002176 A1 | 1/2020 | Gorton | |
| 2020/0075502 A1 | 3/2020 | Kim et al. | |
| 2020/0161252 A1 | 5/2020 | Yang et al. | |
| 2020/0227338 A1 | 7/2020 | Gong | |
| 2020/0388552 A1 | 12/2020 | Chou et al. | |
| 2021/0005512 A1 | 1/2021 | Liu et al. | |
| 2021/0028122 A1 | 1/2021 | Son et al. | |
| 2021/0151357 A1 | 5/2021 | Cook et al. | |
| 2021/0257346 A1 | 8/2021 | Baloglu et al. | |
| 2022/0002157 A1 | 1/2022 | Corrigan et al. | |
| 2022/0066703 A1 | 3/2022 | Hayes | |
| 2022/0352398 A1 | 11/2022 | Munshi et al. | |
| 2022/0359418 A1 | 11/2022 | Jung et al. | |
| 2023/0320106 A1 | 10/2023 | Mun | |
| 2023/0323067 A1 | 10/2023 | Yoshida et al. | |
| 2024/0096736 A1 | 3/2024 | Shin et al. | |
| 2024/0128200 A1 | 4/2024 | Shin et al. | |
| 2024/0153783 A1 | 5/2024 | Lee et al. | |
| 2024/0194628 A1 | 6/2024 | Shin et al. | |
| 2024/0194629 A1 | 6/2024 | Shin et al. | |
| 2024/0213328 A1 | 6/2024 | Bejugam et al. | |
| 2024/0234291 A1 | 7/2024 | Shin et al. | |

FOREIGN PATENT DOCUMENTS

| | | | |
|---|---|---|---|
| KR | 101465616 B1 | 11/2014 | |
| KR | 20150142090 A | 12/2015 | |
| KR | 101895114 B1 | 9/2018 | |
| KR | 10-2395247 | 5/2022 | |
| TW | 202134169 A | 9/2021 | |
| WO | 2022113729 A1 | 6/2022 | |

OTHER PUBLICATIONS

Yu Seong Lee, Laser-Sintered Silver Nanoparticles as a Die Adhesive Layer for High-Power Light-Emitting Diodes, IEEE Transactions on Components, Packaging and Manufacturing Technology. vol. 4, No. 7, Jul. 2014, pp. 1119-1124.

\* cited by examiner

SEMICONDUCTOR DEVICE AND METHOD OF MAKING A SEMICONDUCTOR PACKAGE WITH GRAPHENE-COATED INTERCONNECTS

FIELD OF THE INVENTION

The present invention relates in general to semiconductor devices and, more particularly, to a semiconductor device and method of making a semiconductor package with graphene-coated interconnects.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, power conversion, photo-electric, and creating visual images for television displays. Semiconductor devices are found in the fields of communications, networks, computers, entertainment, and consumer products. Semiconductor devices are also found in military applications, aviation, automotive, industrial controllers, and office equipment.

Semiconductor devices often contain vertical interconnect structures to electrically couple stacked substrates or interposers. Today's devices, in particular for cutting-edge high-bandwidth applications, generate significant heat due to the ever-increasing amount of processing required and demand for ever-shrinking devices. Moreover, devices are more subject to, and less protected from, internal stresses from vibration and physical shock. The vertical interconnects within semiconductor packages must be able to withstand the high temperatures and internal stresses that result from being in a small semiconductor package within a small electronic device. Therefore, a need exists for advanced structures and materials for interconnects with improved heat dissipation and hardness.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The features shown in the figures are not necessarily drawn to scale. Elements having a similar function are assigned the same reference number in the figures. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the semiconductor package. The electrical connections can be made with conductive layers, bumps, stud bumps, conductive paste, or wirebonds. An encapsulant or other molding material is deposited over the semiconductor package to provide physical support and electrical isolation. The finished semiconductor package is then inserted into an electrical system and the functionality of the semiconductor device is made available to the other system components.

Figure 1A:
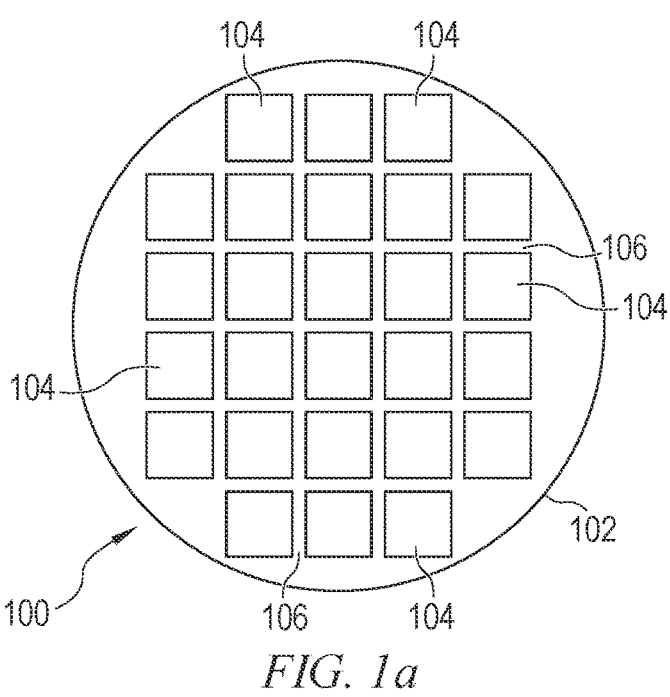
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or electrical components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm). Alternatively, wafer 100 can be a mold surface, organic or inorganic substrate, or target substrate suitable for graphene transfer.

Figure 1B:
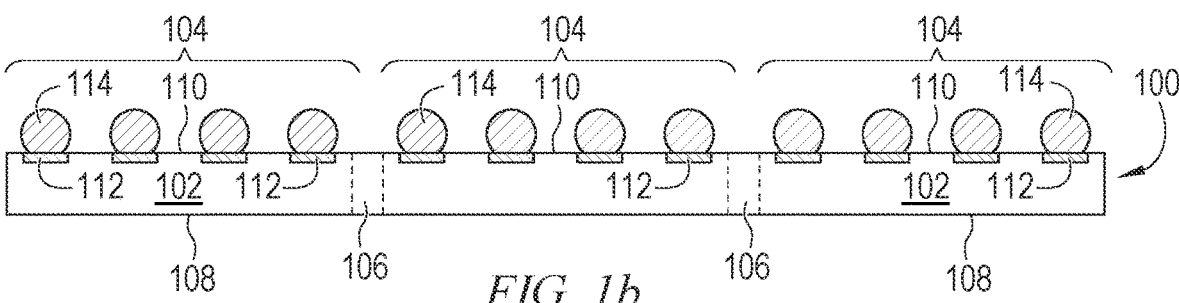

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed over or within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, power devices, or other signal processing circuit. Semiconductor die 104 may also contain IPDs, such as inductors, capacitors, and resistors, for RF signal processing.

An electrically conductive layer 112 is formed over active surface 110 using physical vapor deposition (PVD), chemical vapor deposition (CVD), electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Figure 1C:
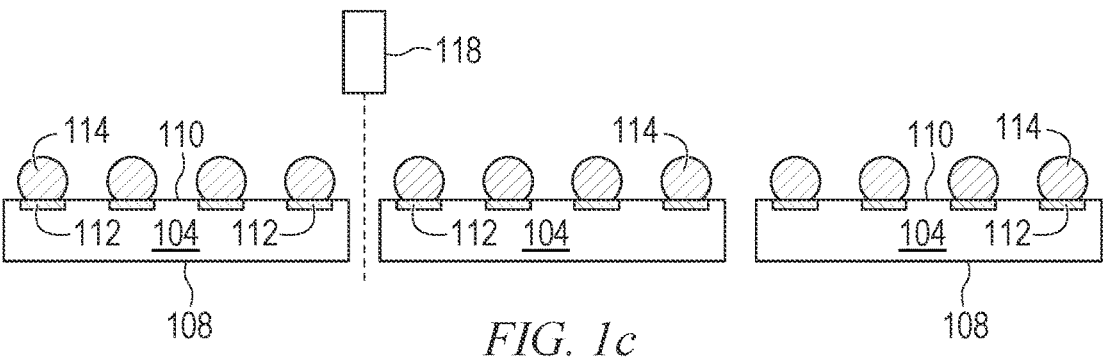

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die (KGD) or known good unit (KGU) after singulation.

Figures 2A, 2B, 2C:
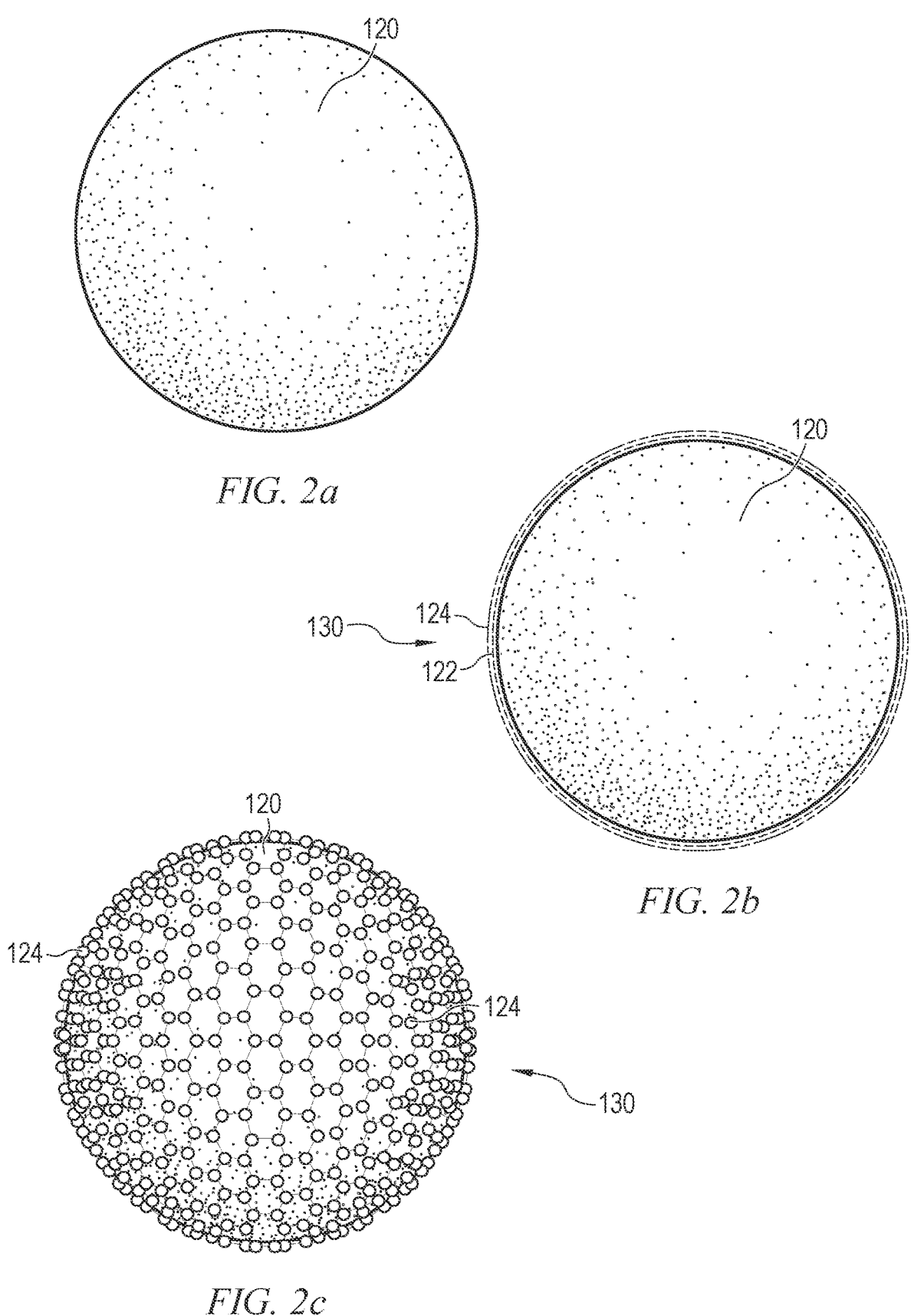
FIGS. 2a-2c illustrate a process of forming a graphene-coated interconnect.

FIGS. 2a-2c illustrate forming a graphene-coated interconnect. FIG. 2a shows a core 120. Core 120 is a ball or sphere formed from Cu, Ni, Au, Ag, Al, Fe, combinations or alloys thereof, other metals or conductive material, or another suitable material. A sphere is selected as being a convenient shape for the disclosed use. However, other shapes can be used for the interconnect, such as cylindrical or polygonal conductive pillars. The shape of core 120 defines the shape of the ultimate interconnect being formed.

FIG. 2b illustrates intermediate coating 122 and graphene coating 124 formed over and around the external surface of core 120 to create graphene-coated interconnect 130. In one embodiment, intermediate coating 122 is an intermediate polymer coating. In some embodiments, intermediate coating 122 is a conductive material. In other embodiments, intermediate coating 122 is a first graphene coating under second graphene coating 124. Using only graphene coating 124 without intermediate coating 122 is also possible. Additional aspects of intermediate coating 122 and graphene coating 124 are discussed in Korean Patent No. KR101465616B1 and U.S. Pat. No. 10,421,123, which are both incorporated herein by reference.

FIG. 2c illustrates further detail of graphene coating 124 being formed as a mesh network around the surface of core 120. Graphene coating 124 forms a shell around core 120. Graphene coating 124 is an allotrope of carbon with one or more layers of carbon atoms each arranged in a two-dimensional (2D) honeycomb lattice. Graphene coating 124 can be formed by CVD, wet chemical synthesis, or other suitable means.

For CVD, core 120 is placed in a chamber heated to 900-1080° C. A gas mixture of $CH_4/H_2/Ar$ is introduced into the chamber to initiate a CVD reaction. The carbon source decomposes in the high-temperature reaction chamber as the CVD reaction separates the carbon atoms from the hydrogen atoms, leaving graphene coating 124 on core 120. The release of carbon atoms over core 120 forms a continuous sheet of graphene coating 124. Additional information related to forming graphene coating is disclosed in U.S. Pat. Nos. 8,535,553, 10,421,123, and Korean Patent No. KR101895114, which are all incorporated herein by reference.

The properties of graphene are summarized in Table 1:

TABLE 1

| Properties of graphene | |
|---|---|
| Parameter | |
| Electronic mobility | $2 \times 10^5$ cm$^2$/Vs |
| Current density | $10^9$ A/cm |
| Velocity of fermion (electron) | $10^6$ m/s |
| Thermal conductivity | 4000-5000 W/mK |
| Tensile strength | 1.5 TPa |
| Breaking strength | 42 N/m |
| Transparency | 97.7% |
| Elastic limit | 20% |
| Specific surface area | 2360 m$^2$/g |

Table 2 compares graphene against silver or copper as alternatives:

TABLE 2

| Graphene Compared to Silver and Copper | | | |
|---|---|---|---|
| Material | Graphene | Silver | Copper |
| $\rho(\Omega \cdot m)$ at 20° C. | $1.00 \times 10^{-8}$ | $1.59 \times 10^{-8}$ | $1.68 \times 10^{-8}$ |
| $\sigma$(S/m) at 20° C. | $1.00 \times 10^8$ | $6.40 \times 10^7$ | $5.96 \times 10^7$ |
| Temperature Coefficient (K$^{-1}$) | −0.0002 | 0.0038 | 0.003862 |
| Density (g/cm$^3$) | 1.5-2.0 | 10.49 | 8.96 |

Graphene-coated interconnects 130 with graphene coating 124 have 100-times the electrical conductivity of Cu balls alone, and a hardness 200 times harder than steel. Graphene coating 124 reduces or eliminates oxidation of core 120. Graphene coating 124 with a Cu core 120 is low cost. Graphene coating 124 has a low moisture permeability and a high thermal conductivity of 4000-5000 W/mK, 10 times higher than Cu at room temperature. Since carbon also has a good solderability and wettability of solder paste, graphene-coated interconnects 130 can be readily incorporated into existing semiconductor package topologies. Graphene coating 124 exhibits a high degree of flexibility and remains stable against warpage. Graphene-coated interconnects 130 improve electrical conductivity while lowering manufacturing cost.

Figure 3A:
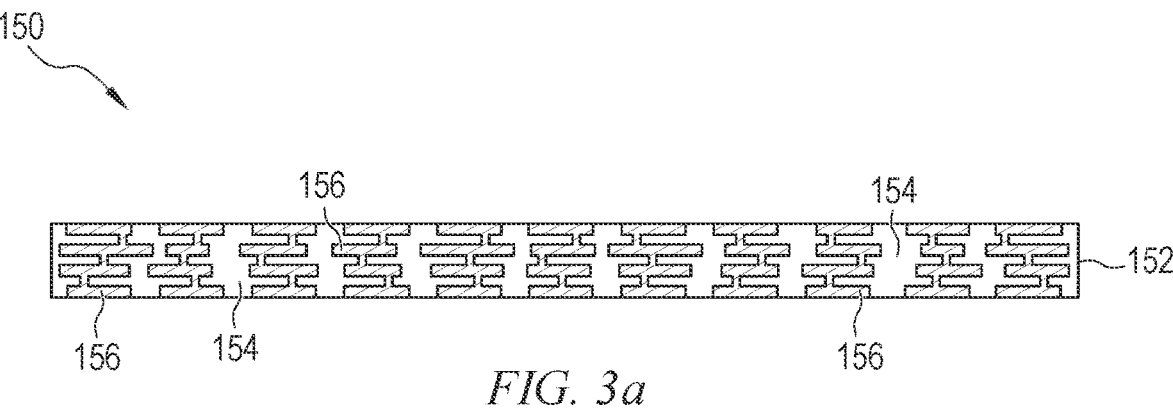
FIGS. 3a-3j illustrate a process of forming a semiconductor package with the graphene-coated interconnect.

FIGS. 3a-3j illustrate forming a semiconductor package 150 with graphene-coated interconnects 130. FIG. 3a shows a substrate 152 being provided as an initial step. While only a single substrate 152 is shown, hundreds or thousands of substrates are commonly processed on a common carrier, using the same steps described herein for a single unit but performed en masse. Substrate 152 could also start out as a single large substrate for multiple units, which are singulated from each other during or after the manufacturing process.

Substrate 152 includes one or more insulating layers 154 interleaved with one or more conductive layers 156. Insulating layer 154 is a core insulating board in one embodiment, with conductive layers 156 patterned over the top and bottom surfaces, e.g., a copper-clad laminate substrate. Conductive layers 156 also include conductive vias electrically coupled through insulating layers 154. Substrate 152 can include any number of conductive and insulating layers interleaved over each other. A solder mask or passivation layer can be formed over either side of substrate 152. Any suitable type of substrate or leadframe is used for substrate 152 in other embodiments.

Figure 3B:
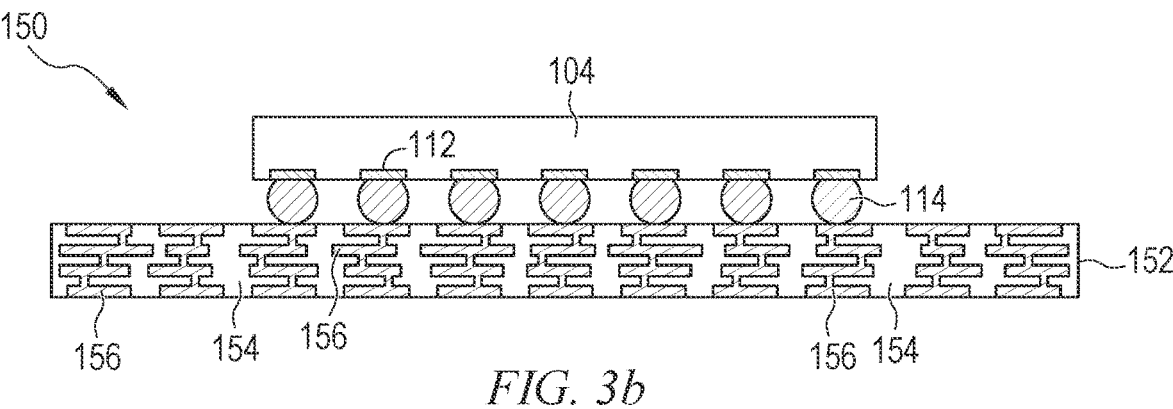

Forming semiconductor package 150 on substrate 152 begins with mounting semiconductor die 104 to the substrate in FIG. 3b. Additional semiconductor die, discrete active or passive components, or any other desired components can be mounted adjacent to semiconductor die 104 as desired to implement the intended functionality of semiconductor package 150. Any number, type, and combination of semiconductor die and other electrical components can be used to make semiconductor package 150.

Solder bumps 114 are reflowed between semiconductor die 104 and substrate 152 to mechanically and electrically connect the semiconductor die to the substrate. A mold underfill is dispensed onto substrate 152 or semiconductor die 104 prior to mounting of the semiconductor die. In other embodiments, the mold underfill is dispensed between semiconductor die 104 and substrate 152 after mounting.

Figure 3C:
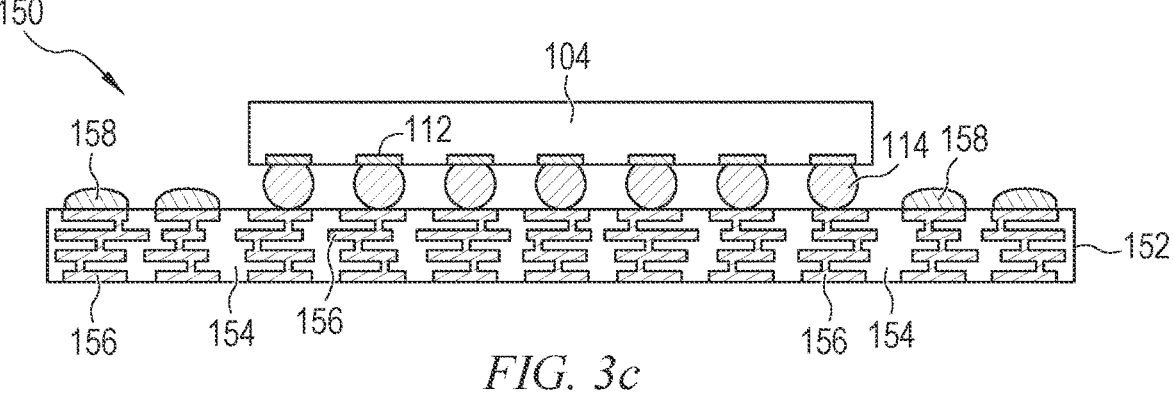

In FIG. 3c, solder paste 158 is printed using a print head or mask, or otherwise disposed on contact pads of conductive layer 156 exposed on the top surface of substrate 152. Solder, conductive epoxy, or another conductive material is used in other embodiments. Solder paste 158 is disposed at locations of substrate 152 where a vertical interconnect is desired within the semiconductor package.

Figure 3D:
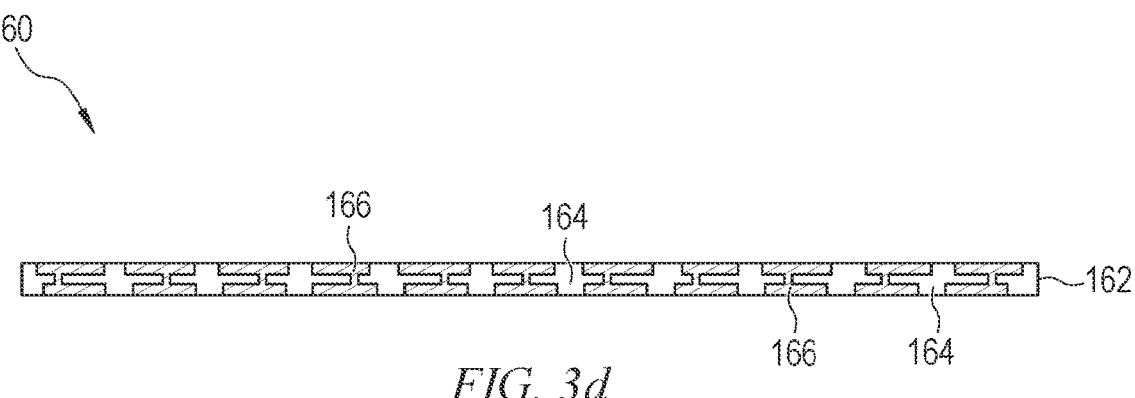
Figure 3E:
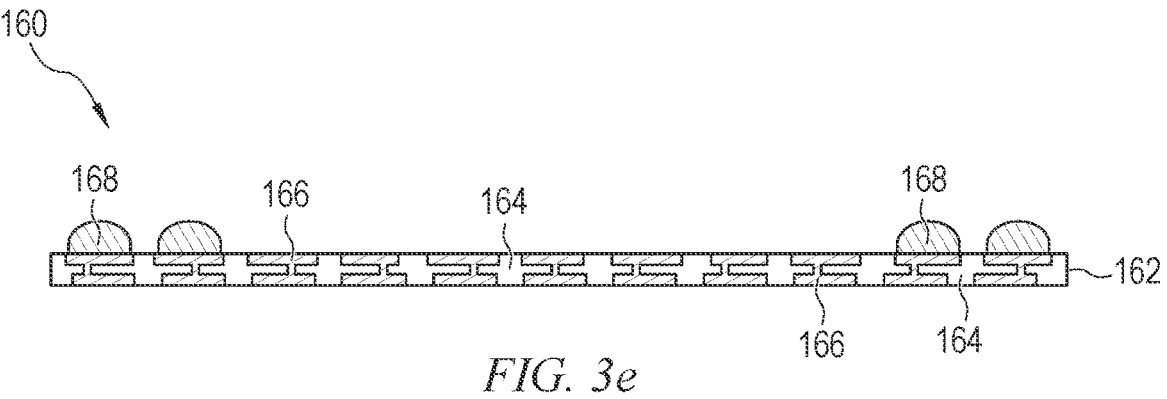
Figure 3F:
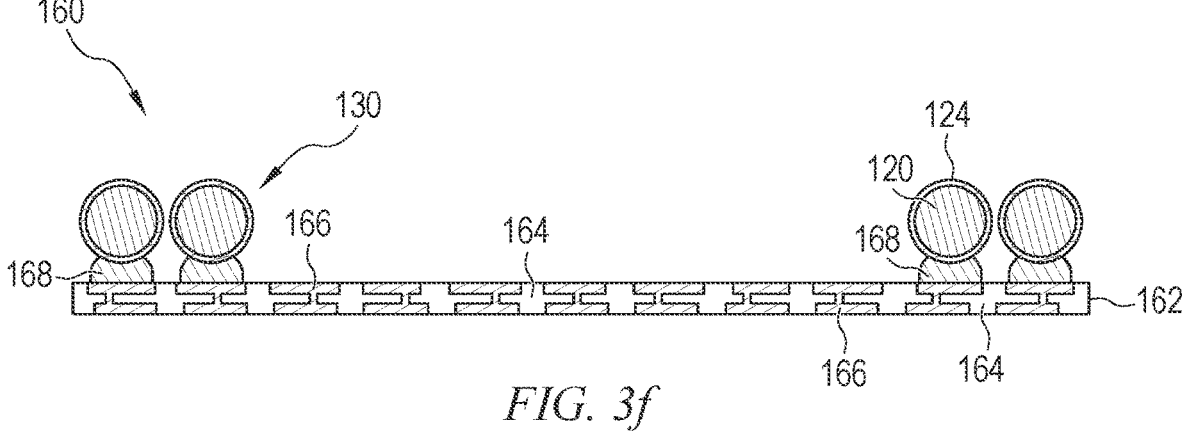

A top substrate module 160 for semiconductor package 150 is formed in FIGS. 3d-3f. Substrate 162 in FIG. 3d is similar to substrate 152 in FIG. 3d and includes insulating layers 164 interleaved with conductive layers 166. Conductive layers 166 are interconnected to each other with conductive vias as with substrate 152. Substrate 162 can be an individual unit substrate previously singulated or remain as a large panel to form substrate modules 160 for a plurality of units at once more easily. While substrate 162 is drawn with two stacked conductive layers and substrate 152 is drawn with four stacked conductive layers, both substrates can be formed with any number of conductive and insulating layers. Any type of package substrate or leadframe can be used for substrate 162 as with substrate 152.

Solder paste 168 is disposed on substrate 162 in FIG. 3e, in a similar process to deposition of solder paste 158 in FIG. 3c. Similarly, other types of conductive material or structures can be used. Solder paste 168 is disposed over contact pads of substrate 162 in a pattern that mirrors solder paste 158, so that the discrete spots of paste 168 can be aligned to individual discrete spots of paste 158 once substrate 162 is flipped and aligned over substrate 152.

In FIG. 3f, a graphene-coated interconnect 130 is disposed on each discrete portion of solder paste 168. Solder paste 168 deforms and sticks graphene-coated interconnects 140 to substrate 162 sufficient to allow flipping substrate 162 without the graphene-coated interconnects moving significantly. In other embodiments, solder paste 168 is reflowed to more securely attach graphene-coated interconnects 130 to substrate 162.

Figure 3G:
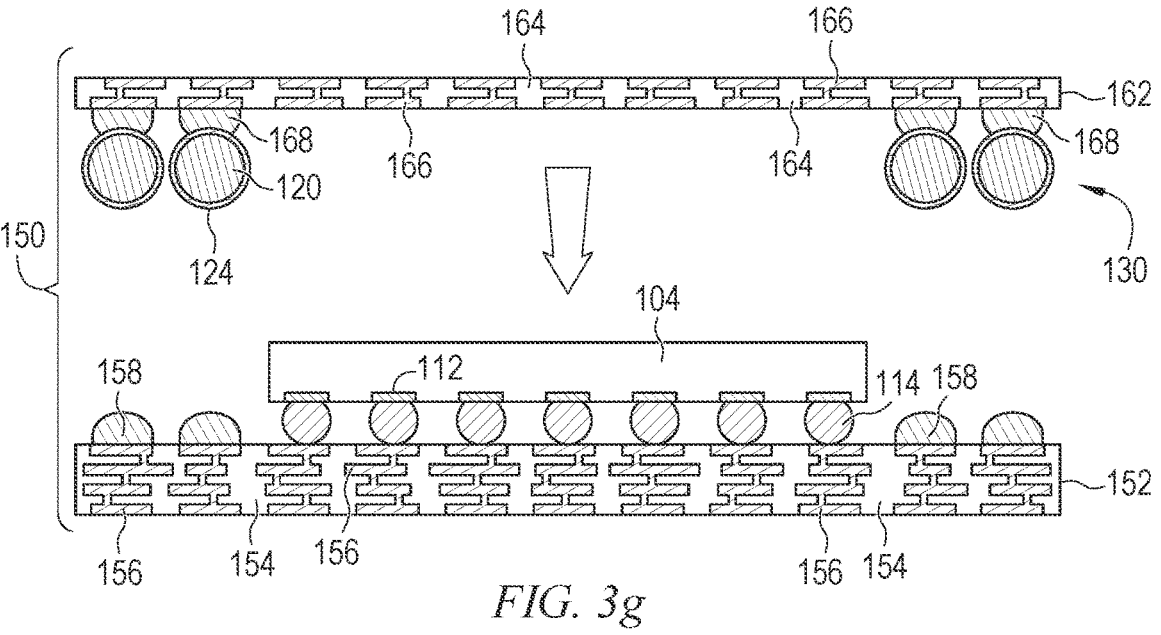
Figure 3H:
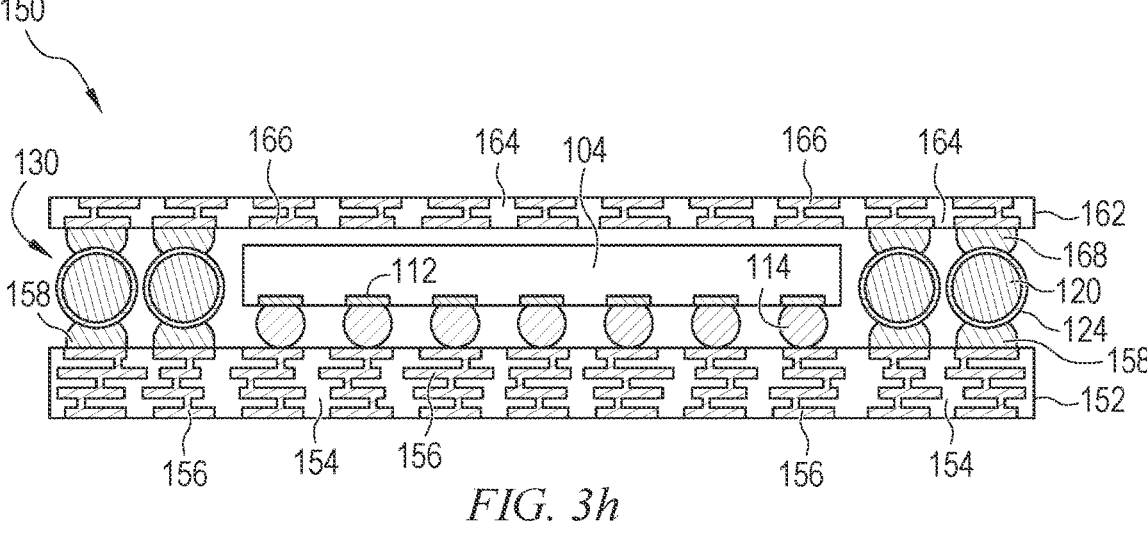

Top substrate module 160 is flipped and disposed over substrate 152 in FIG. 3g to continue the process of forming semiconductor package 150. Both substrate 152 and 162 may remain as a large panel with multiple units, or one or both substrates may be singulated prior to the step shown in FIG. 3g. Top substrate module 160 is lowered down until graphene-coated interconnects 130 are resting on solder paste 158 in FIG. 3h. A small gap optionally remains between substrate 162 and semiconductor die 104. Semiconductor package 150 is heated to reflow solder paste 158 and 168 to physically attach and electrically connect top substrate module 160 to substrate 152 through the solder paste and graphene-coated interconnects 130.

Figure 3I:
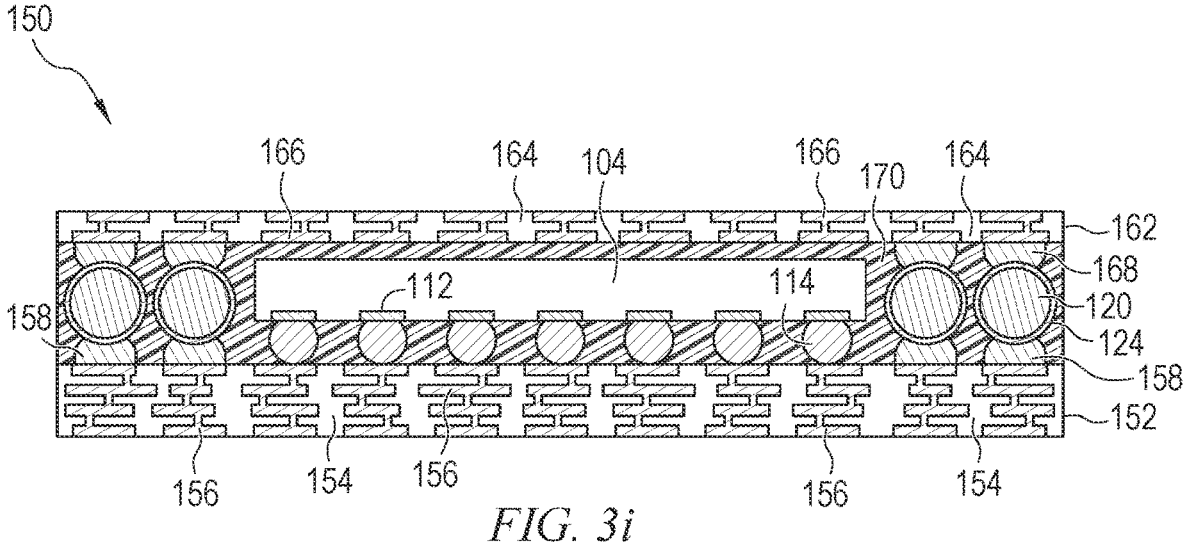

In FIG. 3i, an encapsulant or molding compound 170 is deposited between substrates 152 and 162, and over and around semiconductor die 104 and graphene-coated interconnects 130 using a paste printing, compressive molding, transfer molding, liquid encapsulant molding, vacuum lamination, spin coating, or other suitable applicator. Encapsulant 170 can be polymer composite material, such as epoxy resin, epoxy acrylate, or polymer with or without filler. Encapsulant 170 is non-conductive, provides structural support, and environmentally protects the semiconductor device from external elements and contaminants. Encapsulant 170 flows below semiconductor die 104 between conductive bumps 114, and between graphene-coated interconnects 130, to completely fill the space between substrates 152 and 162.

Figure 3J:
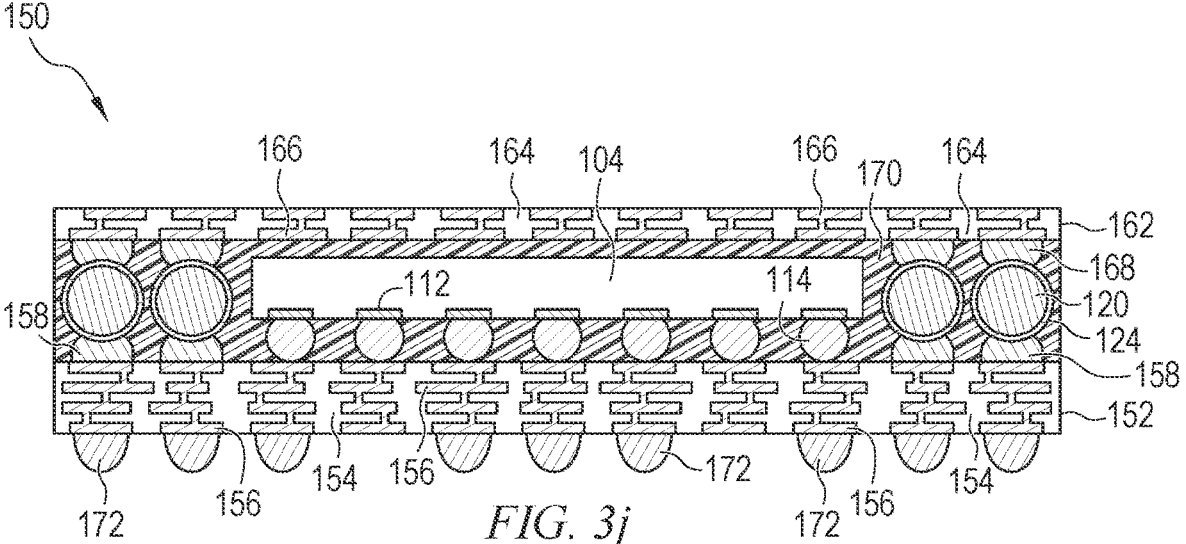

Semiconductor packages 150 are completed in FIG. 3j by optionally forming bumps 172 or another interconnect structure over the top or bottom surface for subsequent integration into a larger electronic system. Bumps 172 can be formed substantially as described above for bumps 114. Bumps 172 can be formed at an earlier stage of the manufacturing process if desired. If semiconductor packages 150 were formed as a panel of multiple devices, the semiconductor packages are singulated from each other through substrate 152, encapsulant 170, and substrate 162 and placed into a tape-and-reel for distribution or placed directly into a larger electrical system.

Semiconductor package 150 utilizes graphene-coated interconnects 130 for vertical interconnect between substrates 152 and 162. Graphene-coated interconnect 130 has a much higher electrical conductivity, thermal conductivity, and hardness compared to alternatives currently existing in the prior art. The increased electrical conductivity improves the suitability for semiconductor package 150 in high-bandwidth use-cases. The increased thermal conductivity helps dissipate heat that can be generated by the processing of high-bandwidth signals. The increased hardness reduces the impact of warpage and helps graphene-coated interconnects 130 to withstand internal stresses. Graphene coating 124 also has good solder wettability, allowing graphene-coated interconnects 130 to be directly attached on a contact pad using solder paste. Graphene coating 124 also reduces or eliminates oxidation of Cu core 120.

Figure 4A:
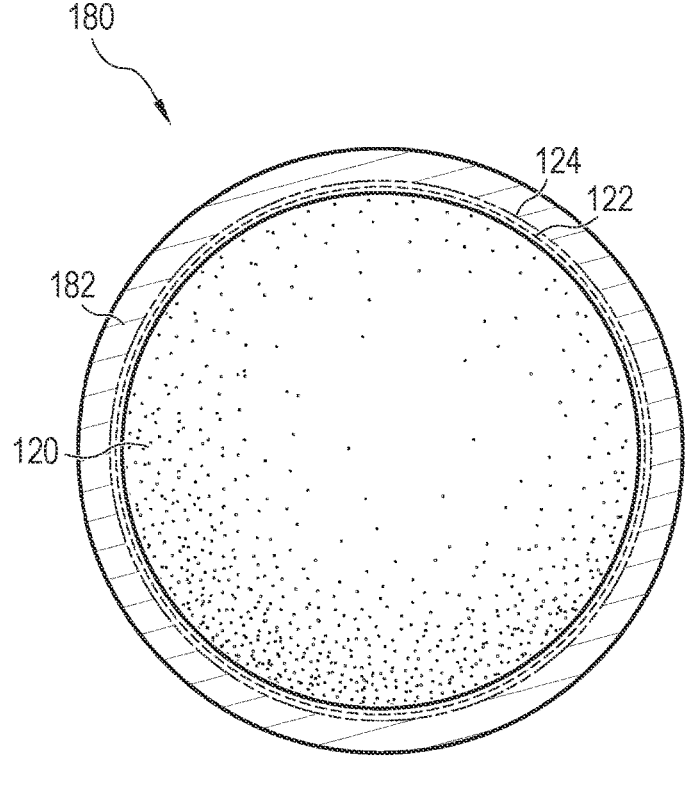
FIGS. 4a and 4b illustrate an additional solder coating around the graphene-coated interconnect.
Figure 4B:
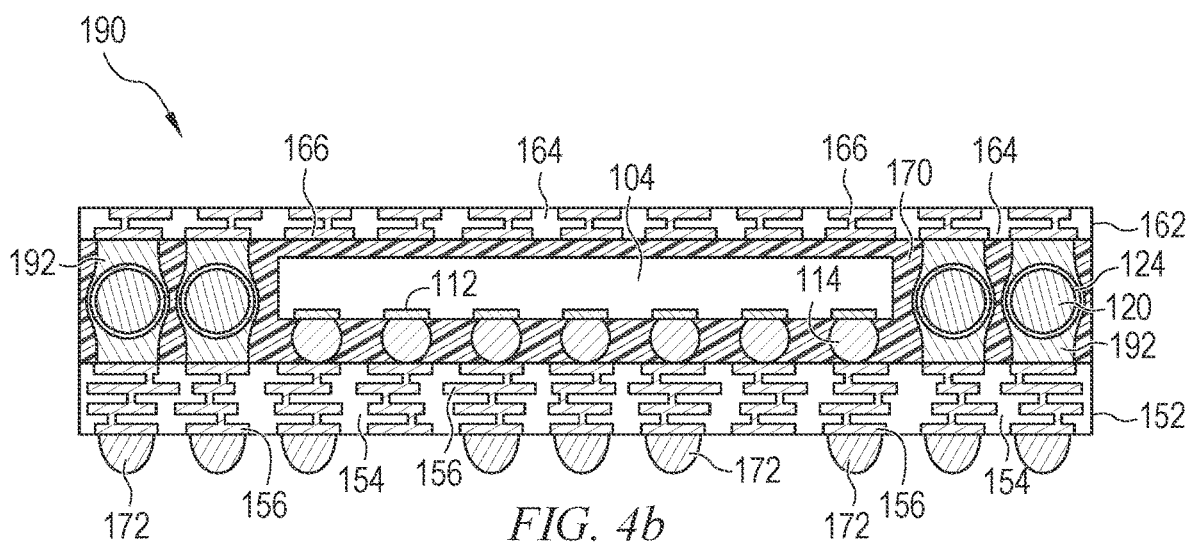

FIG. 4a shows interconnect 180 with a solder coating 182 formed around core 120 and graphene coating 124. Solder coating 182 can be formed by CVD, PVD, sputtering, spraying, liquid coating, or any other suitable process. Semiconductor package 190 in FIG. 4b is formed as shown above in FIGS. 3a-3j, but with interconnects 180 instead of graphene-coated interconnects 130. Solder coating 182 reflows together with solder paste 158 and 168 to form a continuous and uniform extent of solder 192 between substrates 152 and 162 with core 120 and graphene coating 124 disposed within the solder. Interconnect 180 can also be used without separate solder paste 158 and 168, reducing the number of required manufacturing process steps, due to solder coating 182 being sufficient to reflow onto contact pads of both substrates 152 and 162. Interconnect 180 can be used with any of the above- or below-described embodiments.

Figure 5:
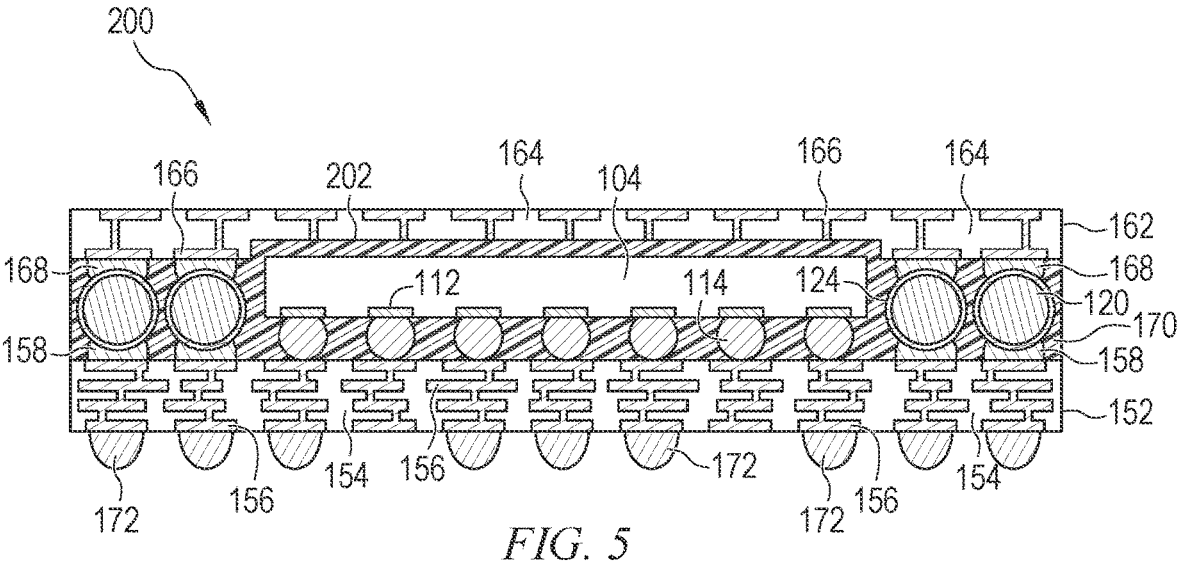
FIG. 5 illustrates an embodiment with a cavity interposer.

FIG. 5 illustrates an embodiment where semiconductor package 200 has a cavity or recess 202 formed in substrate 162 over semiconductor die 104. The top of semiconductor die 104 extends into recess 202. Recess 202 allows substrate 162 to be closer to substrate 152 without physically contacting semiconductor die 104, or allows a taller semiconductor die 104 to be used with the same substrate spacing. Moving substrates 152 and 162 closer together reduces overall interconnect length through the semiconductor package, and thereby electrical resistance. Cavity 202 can be formed in any of the above- or below-described semiconductor packages to accommodate any one or more components disposed between substrates 152 and 162.

Figure 6:
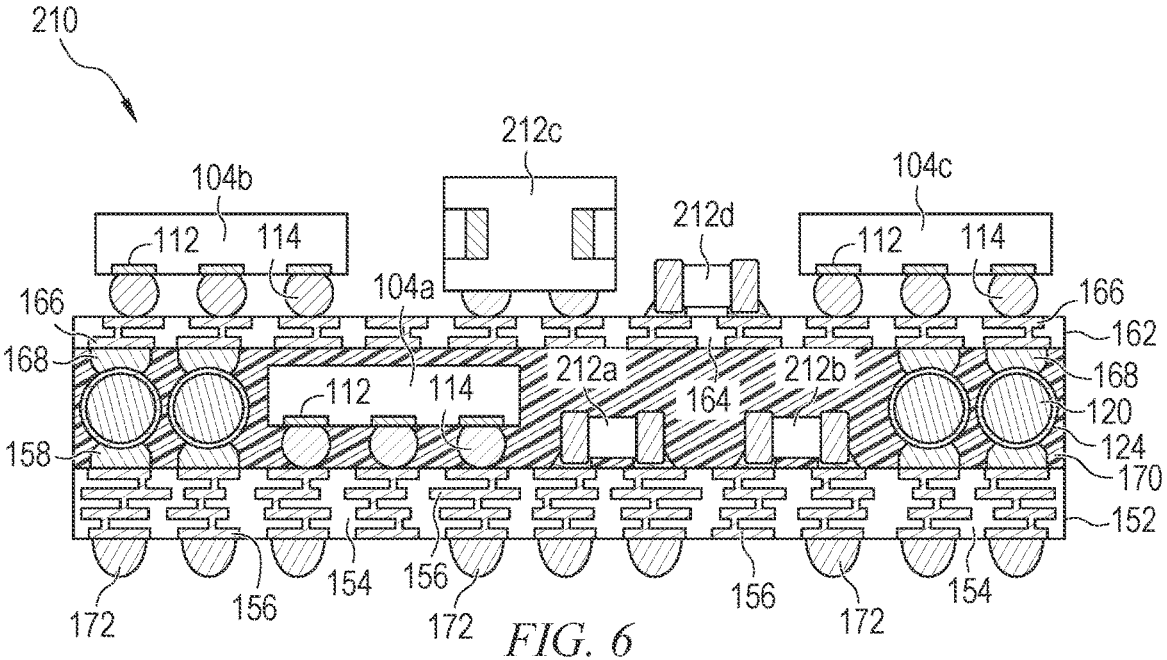
FIG. 6 illustrates a System-in-Package embodiment.

FIG. 6 shows a System-in-Package (SiP) 210 embodiment. SiP 210 is formed in substantially the same manner as described above in relation to FIGS. 3a-3j, with the addition of more electrical and semiconductor components to form a SiP. Discrete active or passive components 212a and 212b are disposed between substrates 152 and 162 along with semiconductor die 104a. Semiconductor die 104b and 104c and discrete active or passive components 212c and 212d are mounted onto substrate 162 opposite substrate 152. Any combination of electrical and semiconductor components can be mounted on either side of either substrate 152 and 162 in any configuration and combination. Additional semiconductor die 104 and components 212 can be provided in any of the above- or below-described embodiments.

Figures 7, 8:
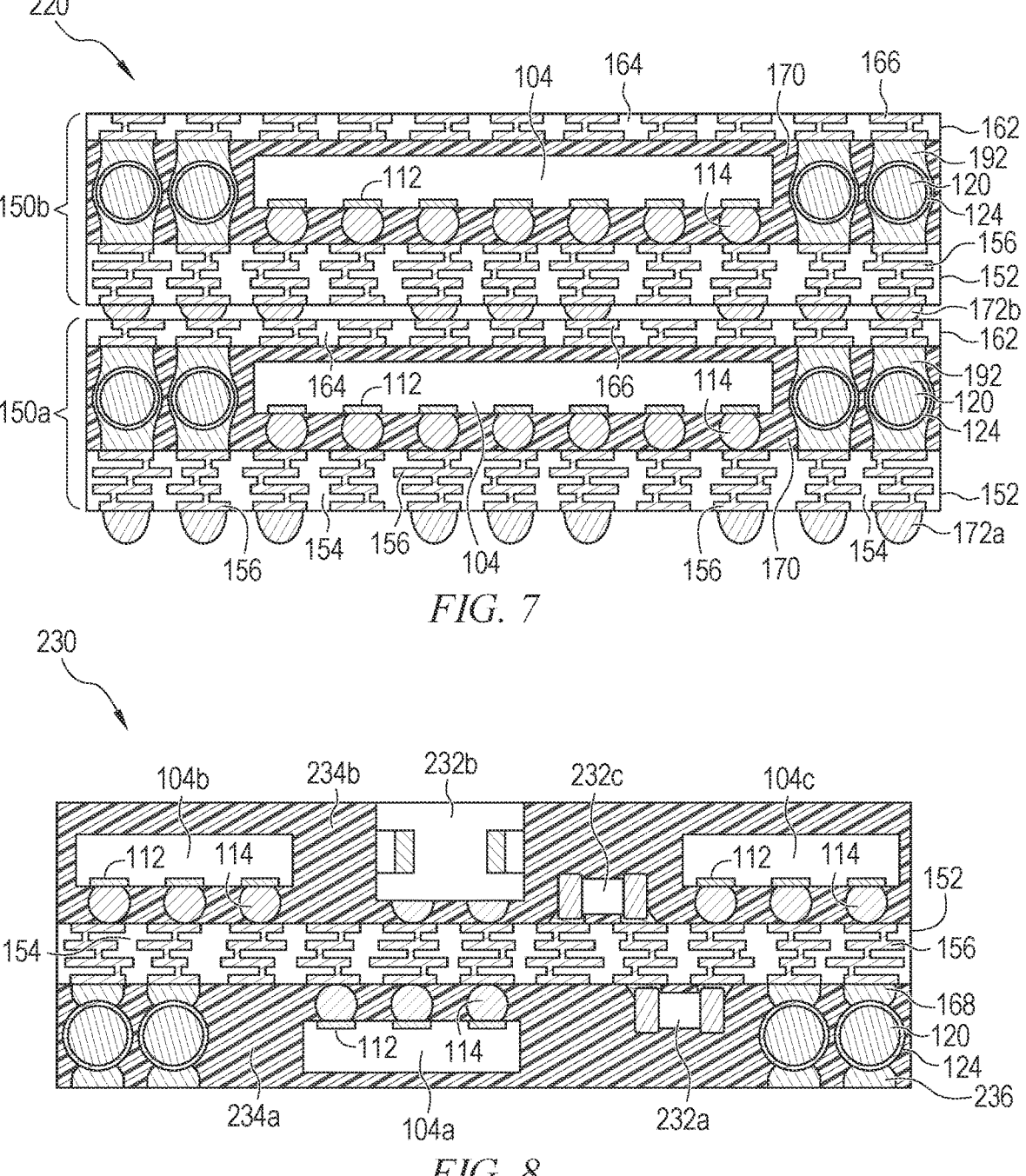
FIG. 7 illustrates a Package-on-Package embodiment.
FIG. 8 illustrates a double-sided molding embodiment.

FIG. 7 illustrates a Package-on-Package (POP) 220 embodiment with two stacked semiconductor packages 150. Semiconductor package 150a is a PoPb (bottom) and semiconductor package 150b is a PoPt (top). Bumps 172b of semiconductor package 150b are reflowed onto contact pads of substrate 162 of the bottom semiconductor package 150a. Bumps 172a of semiconductor package 150a remain exposed for subsequent integration of POP 220 into a larger electrical system. Stacking in a PoP configuration allows more functionality for a single semiconductor package. Utilizing graphene-coated interconnects 130 increases the performance in high-bandwidth applications. Any of the above- or below-described embodiments can be stacked as illustrated in FIG. 7.

FIG. 8 illustrates a double-side molded semiconductor package 230 utilizing graphene-coated interconnects 130 for vertical interconnect. Semiconductor package 230 has only a single substrate 152 with components 104 and 232 mounted on both top and bottom surfaces. Graphene-coated interconnects 130 are mounted onto substrate 152 as above. Encapsulant 234a is deposited over one side of substrate 152 and encapsulant 234b is deposited over the other side. In one embodiment, encapsulants 234a and 234b are formed on substrate 152 together in a single molding step.

Solder 236 is exposed from encapsulant 234a for electrical interconnection of semiconductor package 230 to a larger electrical system. Solder 236 can be disposed on graphene-coated interconnects 130 after mounting the interconnects on substrate 152. The molding process leaves solder 236 exposed for subsequent interconnection by utilizing film-assisted molding or another suitable process. In other embodiments, encapsulant 234a covers solder 236 and openings are formed in the encapsulant after deposition to expose the solder.

Solder 236 can also be applied after encapsulant 234a is deposited, either by forming openings in the encapsulant to expose graphene-coated interconnects 130 or by molding the encapsulant in a manner that keeps the interconnects exposed. In other embodiments, interconnects 180 with solder coating 182 pre-formed over graphene coating 124 are used and neither of solder paste 168 or solder 236 are necessary. Solder coating 182 remains exposed from encapsulant 234a in the final semiconductor package 230 for subsequent interconnect. Graphene-coated interconnects 130 can be added on top in addition to on bottom of substrate 152 to form a stackable package 230, or simply to add more semiconductor components on top of the package.

Figure 9A:
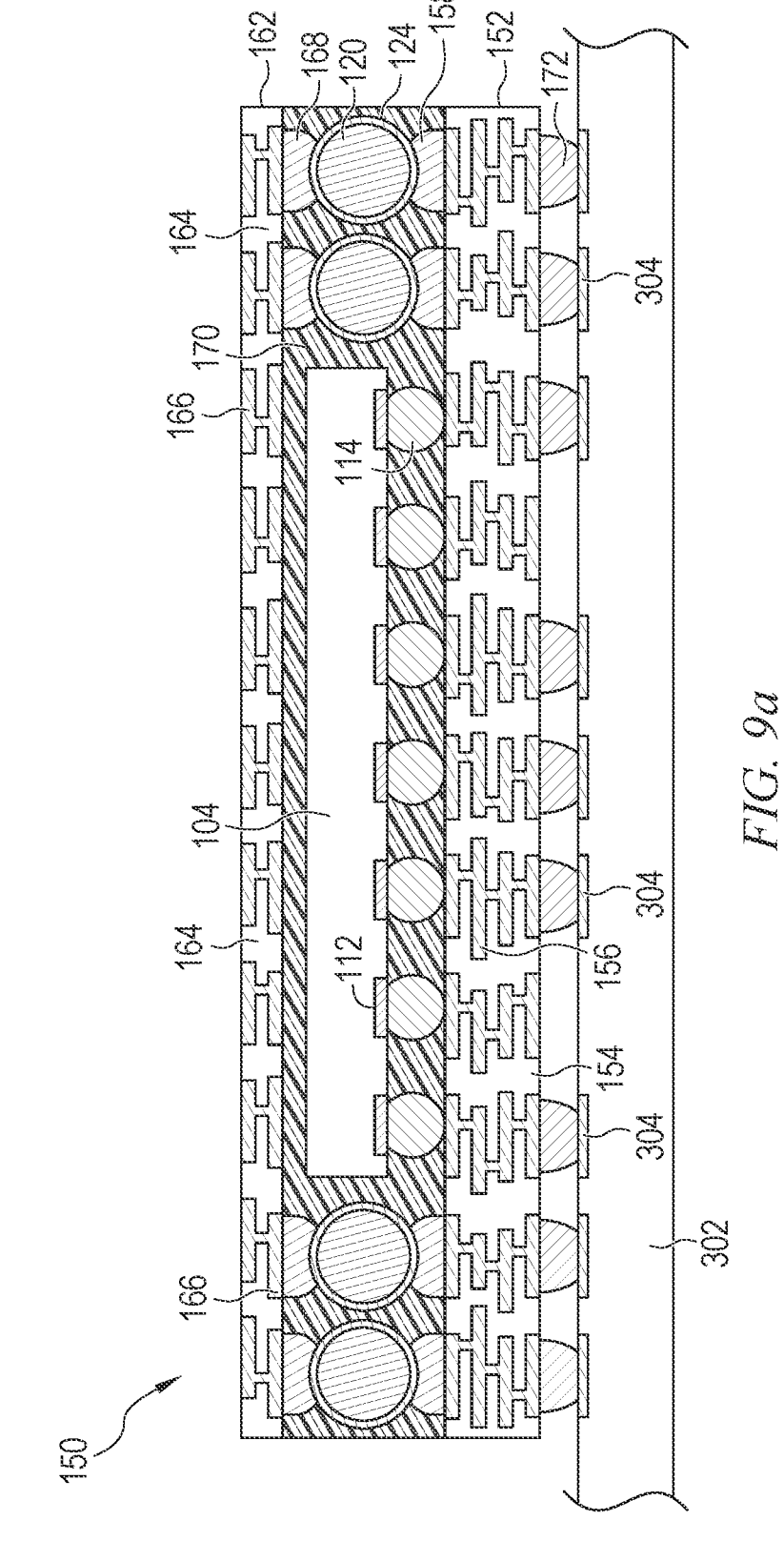
FIGS. 9a and 9b illustrate integrating the semiconductor packages into an electronic device.
Figure 9B:
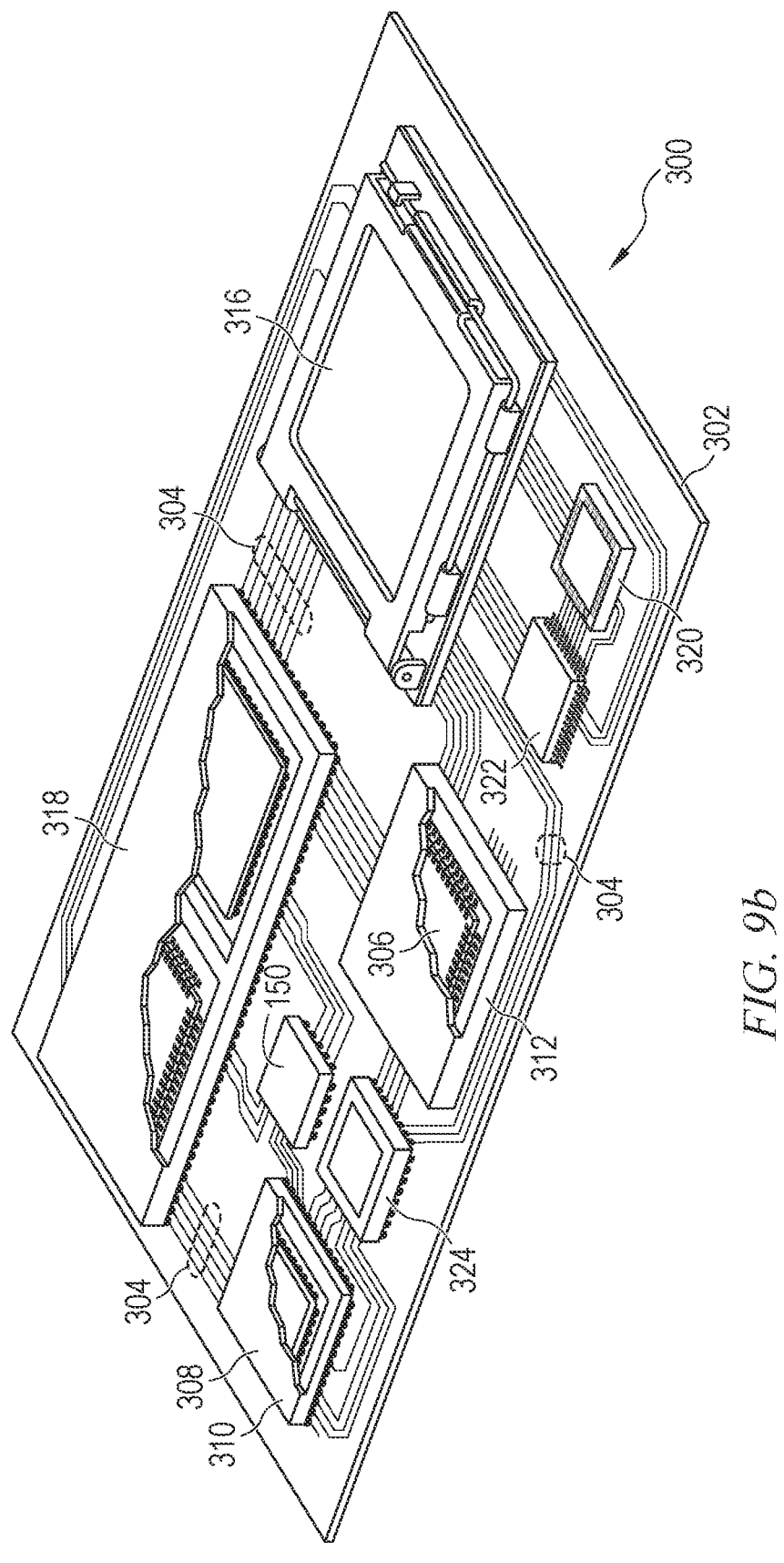

FIGS. 9a and 9b illustrate integrating the above-described semiconductor packages, e.g., semiconductor package 150, into a larger electronic device 300. FIG. 9a illustrates a partial cross-section of semiconductor package 150 mounted onto a printed circuit board (PCB) or other substrate 302 as part of electronic device 300. Bumps 172 are reflowed onto conductive layer 304 of PCB 302 to physically attach and electrically connect semiconductor package 150 to the PCB. In other embodiments, thermocompression or other suitable attachment and connection methods are used. In some embodiments, an adhesive or underfill layer is used between semiconductor package 150 and PCB 302. Semiconductor die 104 is electrically coupled to conductive layer 304 through substrate 152.

FIG. 9b illustrates electronic device 300 including PCB 302 with a plurality of semiconductor packages mounted on a surface of the PCB, including semiconductor package 150. Electronic device 300 can have one type of semiconductor package, or multiple types of semiconductor packages, depending on the application. Electronic device 300 can be a stand-alone system that uses the semiconductor packages to perform one or more electrical functions. Alternatively, electronic device 300 can be a subcomponent of a larger system. For example, electronic device 300 can be part of a tablet computer, cellular phone, digital camera, communication system, or other electronic device. Electronic device 300 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

In FIG. 9b, PCB 302 provides a general substrate for structural support and electrical interconnection of the semiconductor packages mounted on the PCB. Conductive signal traces 304 are formed over a surface or within layers of PCB 302 using evaporation, electrolytic plating, electroless plating, screen printing, or other suitable metal deposition process. Signal traces 304 provide for electrical communication between the semiconductor packages, mounted components, and other external systems or components. Traces 304 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 302. In other embodiments, a semiconductor device may only have the first level packaging where the die is mechanically and electrically mounted directly to PCB 302.

For the purpose of illustration, several types of first level packaging, including bond wire package 306 and flipchip 308, are shown on PCB 302. Additionally, several types of second level packaging, including ball grid array (BGA) 310, bump chip carrier (BCC) 312, land grid array (LGA) 316, multi-chip module (MCM) or SIP module 318, quad flat non-leaded package (QFN) 320, embedded wafer level ball grid array (eWLB) 324, and wafer level chip scale package (WLCSP) 326 are shown mounted on PCB 302. In one embodiment, eWLB 324 is a fan-out wafer level package (Fo-WLP) and WLCSP 326 is a fan-in wafer level package (Fi-WLP).

Depending upon the system requirements, any combination of semiconductor packages, configured with any combination of first and second level packaging styles, as well as other electronic components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a first substrate;
   disposing a semiconductor die over the first substrate;
   providing a second substrate;
   forming a graphene-coated interconnect by,
      providing a copper core,
      forming a polymer coating on the copper core,
      forming a graphene coating on the polymer coating, and
      forming a solder coating on the graphene coating;
   disposing the graphene-coated interconnect over the second substrate after forming the solder coating on the graphene coating; and
   disposing the second substrate over the first substrate with the semiconductor die and graphene-coated interconnect between the first substrate and second substrate.

2. The method of claim 1, further including:
   disposing a first solder between the graphene-coated interconnect and first substrate;
   disposing a second solder between the graphene-coated interconnect and second substrate; and
   reflowing the first solder, second solder, and solder coating into a single continuous extent of solder between the first substrate and second substrate.

3. The method of claim 1, further including forming a recess in the second substrate over the semiconductor die.

4. The method of claim 1, further including attaching an electrical component to the second substrate opposite the semiconductor die.

5. The method of claim 4, wherein the electrical component includes a second semiconductor die and a second graphene-coated interconnect.

6. The method of claim 1, further including depositing an encapsulant between the first substrate and second substrate.

7. A method of making a semiconductor device, comprising:
   providing a substrate;
   forming a graphene-coated interconnect by,
      providing a copper core,
      forming a polymer coating on the copper core,
      forming a graphene coating on the polymer coating, and
      forming a solder coating on the graphene coating;
   disposing the graphene-coated interconnect over the substrate after forming the solder coating; and
   disposing a semiconductor die over the substrate.

8. The method of claim 7, further including disposing an electrical component over the substrate opposite the semiconductor die.

9. The method of claim 8, further including depositing an encapsulant over the semiconductor die and electrical component.

10. The method of claim 9, wherein the electrical component includes a second semiconductor die.

11. The method of claim 9, further including a solder disposed over the graphene-coated interconnect and exposed from the encapsulant.

12. A method of making a semiconductor device, comprising:
   providing a first substrate and a second substrate;
   forming a graphene-coated interconnect by,
      providing a copper core,
      forming a graphene coating on the copper core, and
      forming a solder coating on the graphene coating;
   disposing the graphene-coated interconnect between the first substrate and second substrate; and
   disposing a semiconductor die between the first substrate and second substrate.

13. The method of claim 12, further including electrically coupling the first substrate to the second substrate through the graphene-coated interconnect.

14. The method of claim 12, further including forming a recess in the second substrate over the semiconductor die.

15. The method of claim 12, further including attaching an electrical component to the second substrate opposite the semiconductor die.

16. The method of claim 15, wherein the electrical component includes a second semiconductor die and a second graphene-coated interconnect.

17. The method of claim 12, further including depositing an encapsulant between the first substrate and second substrate.

18. A method of making a semiconductor device, comprising:
   providing a substrate;
   forming a graphene-coated interconnect by,
      providing a copper core,
      forming a graphene coating on the copper core, and
      forming a solder coating on the graphene coating;
   disposing the graphene-coated interconnect disposed over the substrate;
   disposing a solder between the substrate and the graphene-coated interconnect; and
   disposing a semiconductor die over the substrate.

19. The method of claim 18, wherein the solder is disposed between the graphene-coated interconnect and substrate.

20. The method of claim 19, further including disposing a second solder over the graphene-coated interconnect opposite the substrate.

21. The method of claim 18, further including attaching an electrical component to the substrate opposite the semiconductor die.

22. The method of claim 21, further including depositing an encapsulant over the semiconductor die and electrical component.

23. The method of claim 22, wherein the electrical component includes a second semiconductor die.

24. The method of claim 18, further including disposing a second substrate over the graphene-coated interconnect and semiconductor die.

* * * * *